(12) United States Patent
Ko

(10) Patent No.: US 8,368,414 B2
(45) Date of Patent: Feb. 5, 2013

(54) METHOD AND APPARATUS FOR CONTROLLING POSITION OF Z-AXIS FOR WAFER PROBER

(75) Inventor: Young-Ho Ko, Seoul (KR)

(73) Assignee: Semics Inc. (KR)

( * ) Notice: Subject to any disclaimer, the term of this patent is extended or adjusted under 35 U.S.C. 154(b) by 376 days.

(21) Appl. No.: 12/743,970

(22) PCT Filed: Jul. 22, 2008

(86) PCT No.: PCT/KR2008/004266
§ 371 (c)(1),
(2), (4) Date: May 20, 2010

(87) PCT Pub. No.: WO2009/066852
PCT Pub. Date: May 28, 2009

(65) Prior Publication Data
US 2010/0244877 A1    Sep. 30, 2010

(30) Foreign Application Priority Data

Nov. 22, 2007 (KR) .................. 10-2007-0119916

(51) Int. Cl.
*G01R 31/00* (2006.01)
(52) U.S. Cl. .......... 324/750.16; 324/750.19; 324/754.11
(58) Field of Classification Search .................. None
See application file for complete search history.

(56) References Cited

U.S. PATENT DOCUMENTS

| | | | |
|---|---|---|---|
| 4,528,451 A | 7/1985 | Petric et al. | |
| 5,410,259 A * | 4/1995 | Fujihara et al. | 324/750.23 |
| 6,501,289 B1 * | 12/2002 | Takekoshi | 324/750.19 |
| 6,583,614 B2 | 6/2003 | Takekoshi | |
| 2003/0201765 A1 * | 10/2003 | Takekoshi | 324/158.1 |

FOREIGN PATENT DOCUMENTS

| | | |
|---|---|---|
| JP | 05-264590 | 10/1993 |
| JP | 2000-340620 | 12/2000 |
| KR | 10-2001-0112838 | 12/2001 |
| KR | 10-2004-0064717 | 7/2004 |
| KR | 10-2007-0028611 | 3/2007 |

OTHER PUBLICATIONS

International Search Report—PCT/KR2008/004266 dated Jan. 23, 2009.

* cited by examiner

*Primary Examiner* — Minh N Tang
(74) *Attorney, Agent, or Firm* — Cantor Colburn LLP

(57) ABSTRACT

An apparatus for controlling the Z axis position of a wafer prober includes a first sensor unit including a plurality of pressure sensors distributed and installed between a Z axis support plate, for supporting a Z axis transferring unit and a Z axis base. Actuators are distributed and installed between the Z axis support plate and the Z axis base, and lift up or lower the Z axis support plate. A driving unit drives the actuators. A control module controls the driving unit to drive the actuators in response to pieces of sensed data. The control module drives the actuators when a difference between the pieces of sensed data is greater than a preset difference limit value, thus enabling the chuck plate to be maintained in a horizontal state.

9 Claims, 8 Drawing Sheets

(a)

(b)

(c)

(a)

(b)

METHOD AND APPARATUS FOR CONTROLLING POSITION OF Z-AXIS FOR WAFER PROBER

TECHNICAL FIELD

The present invention relates, in general, to a wafer prober, and, more particularly, to an apparatus and method for controlling the Z axis position of a wafer prober, which determine whether excessive pressure (force) is being applied to the chuck plate of the wafer prober, measure a degree of the tilting of a Z axis base, and corrects the pressure applied to the chuck plate and the tilting of the Z axis base on the basis of the results of the determination and measurement, thus allowing the chuck plate to be maintained in a horizontal state.

BACKGROUND ART

A wafer prober is a device for connecting a plurality of chips on a wafer to a tester. Such a tester is connected to the chips on the wafer through the wafer prober and is configured to provide electrical signals to the chips and inspect the results of provision, thus examining whether abnormalities or defects are present in each of the chips. The construction and operation of the wafer prober are described in brief with reference to FIG. 1. When a wafer 209 on which a plurality of chips is formed is loaded into a chuck plate 208 through a wafer transferring device 204, the chuck plate 208 is transferred in X, Y and Z directions so that a plurality of probes provided in a probe card 210 is aligned and put into contact with pads on the plurality of chips provided on the wafer through a chuck transferring device 206. Here, the X and Y directions denote a direction horizontal to the surface of the chuck plate, and the Z direction denotes a direction perpendicular to the surface of the chuck plate. When the plurality of probes comes into contact with the plurality of pads, respectively, a tester 100 provides test signals corresponding to a predetermined program to the chips through tester connection terminals and the probes, and the chips provide output signals corresponding to the test signals to the tester 100, thus testing each chip for electrical characteristics.

Hereinafter, with reference to FIG. 2, an embodiment of a mechanical component for vertically transferring the chuck plate 208 will be described below.

A wedge-shaped support 212, one surface of which is cut in an inclined shape, is installed on the bottom surface of the chuck plate 208, and a wedge-shaped Z axis transferring unit 216, one surface of which is cut in an inclined shape, is arranged at the location opposite the inclined surface of the support. A rolling bearing 214 is interposed between the support 212 and the Z axis transferring unit 216 to reduce friction therebetween. Here, the inclined surface of the Z axis transferring unit 216 is formed to have a shape corresponding to the inclined surface of the support 212. The inclined surface of the Z axis transferring unit and the inclined surface of the support are arranged opposite each other. A ball screw 218 is installed below the Z axis transferring unit 216, and is configured to move the Z axis transferring unit 216 in a laterally direction while rotating in association with a Z axis motor 220. As the Z axis transferring unit 216 is moved in the lateral direction, the height of the inclined surface of the support 212 facing the Z axis transferring unit 216 is changed. In this way, with the lateral movement of the Z axis transferring unit 216, the chuck plate 208 is vertically transferred. Further, a Z axis base 222 is installed below the Z axis transferring unit to support the bottom of the wafer prober. The Z axis transferring unit 216, the ball screw 218 and the Z axis motor 220 are arranged on the Z axis base 222. The motor 220 produces a predetermined torque used to transfer the Z axis transferring unit 216.

However, the motor may produce an excessive torque due to an unexpected disturbance. In this case, the chuck transferring device excessively transfers the chuck plate in a vertical direction, so that the wafer put on the chuck plate 208 may come into excessively close contact with the probe card, thus causing damage to the wafer and the probes of the probe card. Therefore, in the prior art, the development of technology for determining whether excessive pressure is being applied to the Z axis transferring unit 216 or the chuck plate, and discontinuing transferring the chuck plate in a vertical direction if it is determined that excessive pressure is being applied, is required.

Further, in order to bring the fine pads formed on the wafer into precise contact with the probes of the probe card 210, the control of the position of the chuck plate 208 is very precisely performed, and thus the chuck plate is precisely installed in consideration of a horizontal state. However, there is a problem in that the Z axis base 22 for supporting the Z axis transferring unit 216 may be tilted due to an unexpected disturbance during the use of the wafer prober, thus making it difficult to maintain the chuck plate in a horizontal state. As a result, the development of technology for detecting the tilting of the Z axis transferring unit 216 and correcting the tilting of the chuck plate is required in the prior art.

DISCLOSURE

[Technical Problem]

Accordingly, the present invention has been made keeping in mind the above problems occurring in the prior art, and an object of the present invention is to provide an apparatus and method for controlling the Z axis position of a wafer prober, which detect and correct the tilting of the Z axis of the wafer prober.

Another object of the present invention is to provide an apparatus and method for controlling the Z axis position of a wafer prober, which determines whether excessive pressure is being applied to the Z axis transferring unit of the wafer prober, and discontinue transferring a chuck plate in a vertical direction if it is determined that excessive pressure is being applied.

[Technical Solution]

In accordance with one aspect of the present invention to accomplish the above objects, there is provided an apparatus for controlling a Z axis position of a wafer prober, the wafer prober including a chuck plate, a Z axis transferring unit for vertically transferring the chuck plate, and a Z axis base for supporting the Z axis transferring unit, comprising a Z axis support plate interposed between the Z axis transferring unit and the Z axis base, and configured to support the Z axis transferring unit, a first sensor unit including a plurality of pressure sensors distributed and installed between the Z axis support plate and the Z axis base, a plurality of actuators distributed and installed below the Z axis support plate and configured to lift up or lower the Z axis support plate, an actuator driving unit configured to drive the plurality of actuators, and a control module configured to detect whether the Z axis support plate is tilted using pieces of sensed data provided by the pressure sensors of the first sensor unit, and to drive the actuators by controlling the actuator driving unit on a basis of results of the detection, thus enabling the chuck plate to be maintained in a horizontal state.

Preferably, the control module may set a difference limit value between pieces of sensed data in advance, detect a difference between the pieces of sensed data provided by the first sensor unit, and control the actuator driving unit when the detected difference is greater than the difference limit value.

Preferably, the apparatus may further comprise a motor for providing a driving torque to the Z axis transferring unit and a second sensor unit implemented as a pressure sensor installed between the Z axis transferring unit and the motor, wherein the control module may be provided with sensed data by the second sensor unit, and notifies a main control device of the wafer prober of a message, indicating that excessive pressure is being applied, when the sensed data provided by the second sensor unit is greater than a preset pressure limit value.

Preferably, the apparatus may further comprise one or more displacement measuring instruments respectively installed between one or more of the pressure sensors and a pressure application tool for applying pressure to the pressure sensor, wherein each of the displacement measuring instruments has a slit formed in a direction in which the pressure is being applied, so that, when the applied pressure becomes greater than a predetermined pressure, the displacement measuring instrument is contracted and deformed, thus applying pressure to the one or more pressure sensors.

Preferably, the pressure sensors may be implemented as Capacitive (CAP) sensors, and each of the CAP sensors may comprise a plurality of series-connected variable capacitors, capacitances of which are varied according to pressure, an amplifier disposed at a connection node of the variable capacitors and configured to amplify an output signal, which is varied according to variation in capacitances of the variable capacitors, a demodulator configured to demodulate an output signal of the amplifier, and a filter configured to perform low-pass filtering on an output of the demodulator. Preferably, the actuators may be piezoelectric actuators.

In accordance with another aspect of the present invention to accomplish the above objects, there is provided a method of controlling a Z axis position of a wafer prober, the method being performed by a control module, which controls an operation of a Z axis transferring unit for vertically transferring a chuck plate of the wafer prober, comprising the steps of (a) receiving pieces of sensed data from a plurality of pressure sensors distributed and installed between a Z axis support plate for supporting the Z axis transferring unit and a Z axis base, and (b) driving a plurality of actuators in response to the sensed data received from the plurality of pressure sensors, thus maintaining the chuck plate in a horizontal state, wherein the actuators are distributed and installed between the Z axis support plate and the Z axis base, and are configured to lift up or lower the Z axis support plate through driving of the actuators, thus maintaining the chuck plate in a horizontal state.

[Advantages Effects]

Accordingly, the present invention determines whether excessive pressure is being applied to the Z axis transferring unit of a wafer prober, and discontinues the operation of the Z axis transferring unit if it is determined that excessive pressure is being applied, thus protecting both a wafer and the probes of a probe card.

Further, the present invention detects the degree of the tilting of a Z axis base for supporting a Z axis transferring unit, and corrects a tilted state on the basis of the results of detection, thus precisely controlling the position of the chuck plate.

BEST MODE

Figure 1:
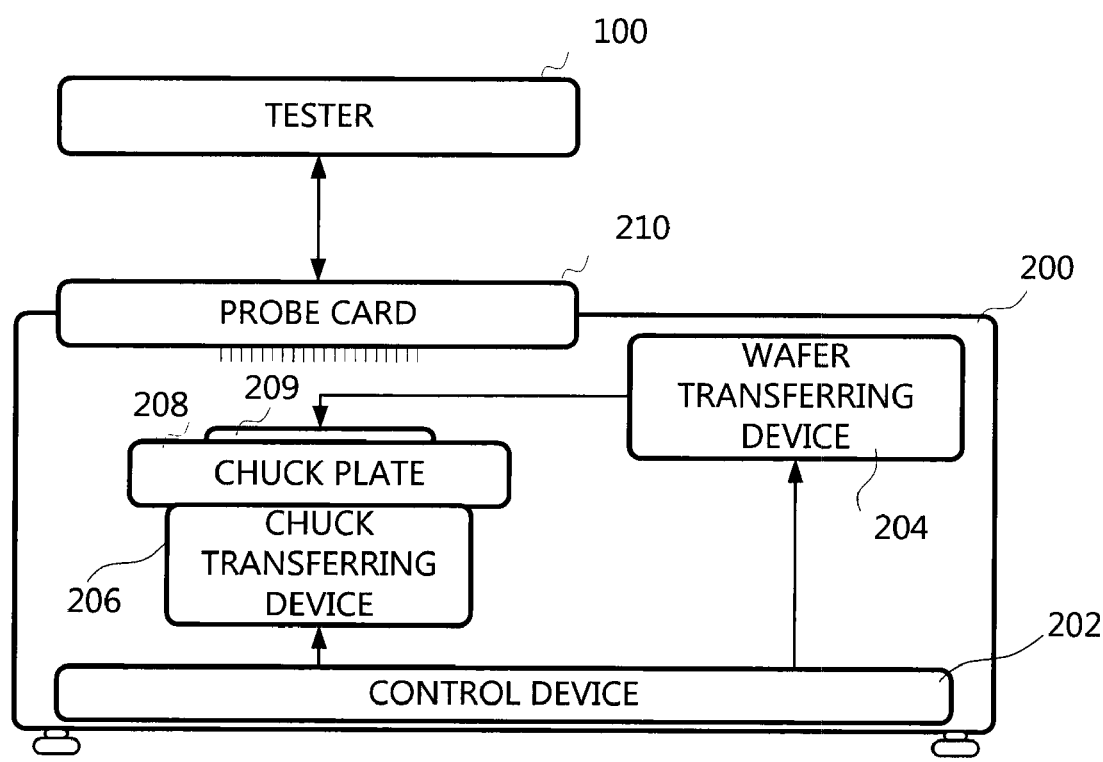
FIG. 1 is a diagram showing the construction of a typical wafer prober.
Figure 2:
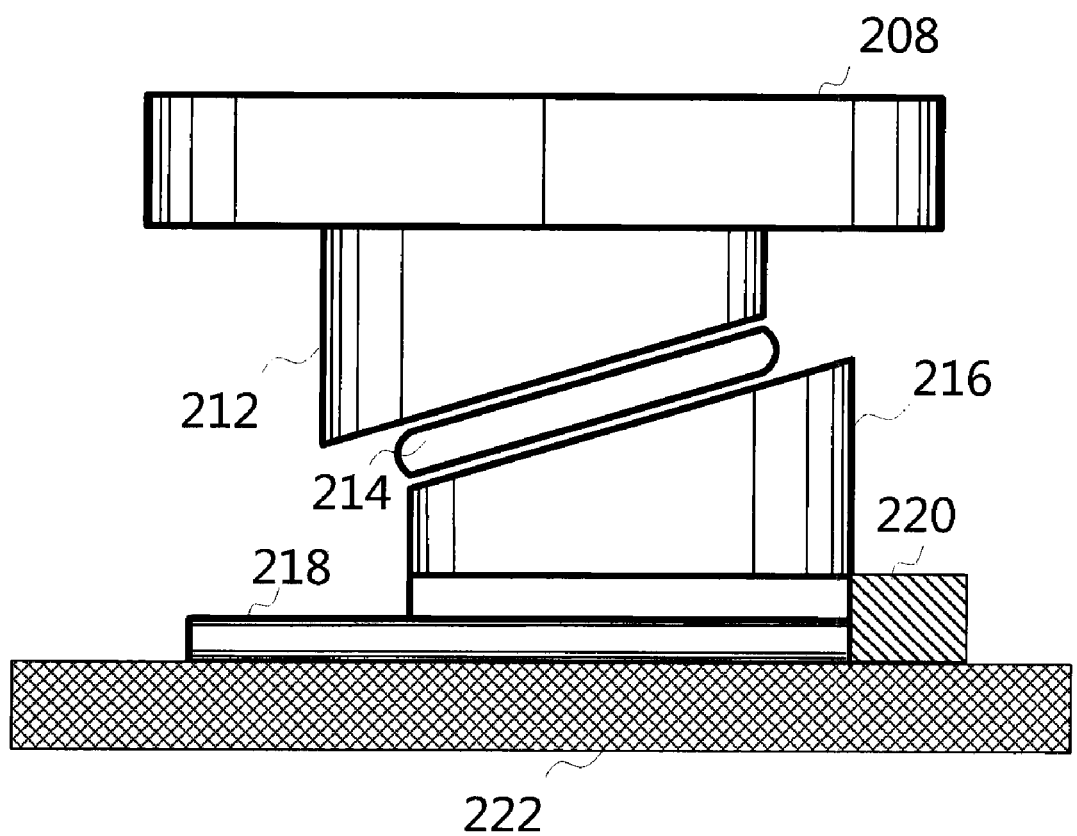
FIG. 2 is a view showing the structure of the Z axis driving device of a typical wafer prober.
Figure 3:
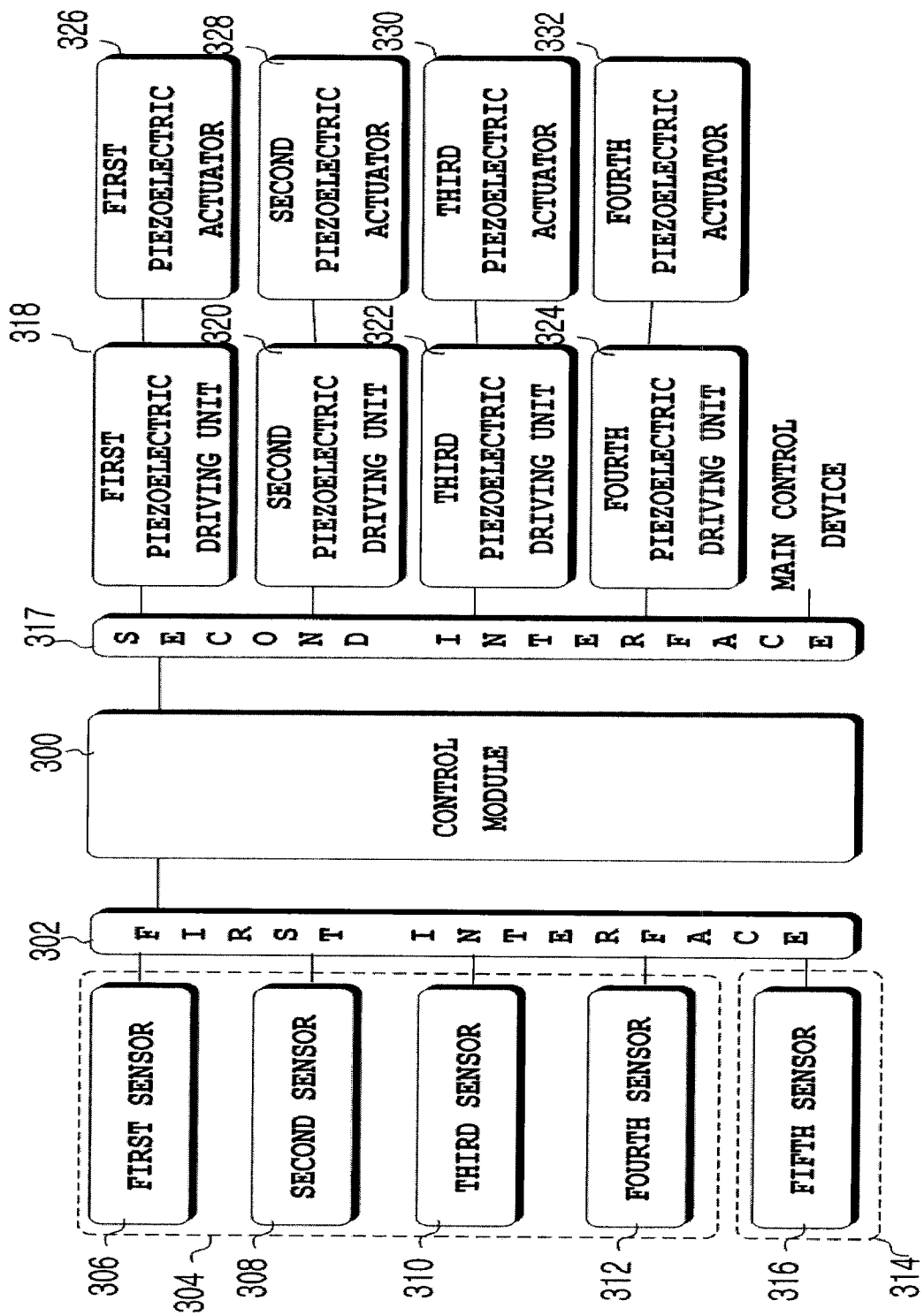
FIG. 3 is a diagram showing an apparatus for controlling the Z axis position of a wafer prober according to an embodiment of the present invention.

FIG. 3 is a block diagram showing the construction of an apparatus for controlling the Z axis position of a wafer prober according to an embodiment of the present invention. Hereinafter, the construction of the apparatus for controlling the Z axis position of a wafer prober according to an embodiment of the present invention will be described in detail.

Referring to FIG. 3, the Z axis position control apparatus includes a control module 300, a first interface 302, a first sensor unit 304, a second sensor unit 314, a second interface 317, first to fourth piezoelectric driving units 318, 320, 322 and 324, and first to fourth piezoelectric actuators 326, 328, 330, and 332.

In accordance with an embodiment of the present invention, the control module 300 senses when excessive pressure is being applied to a Z axis through the first to second sensor units 304 and 314, and notifies a main control device of the application of the excessive pressure, thus informing a manager of the application of the excessive pressure while discontinuing transferring a chuck plate in a Z axis direction. Further, the control module 300 detects whether a Z axis support plate for supporting a Z axis transferring unit is tilted, and adjusts the horizontal position of the Z axis support plate depending on the degree of the tilting of the Z axis support plate, thus maintaining the chuck plate of the wafer prober in a horizontal state.

The first interface 302 provides pieces of sensed data provided by respective sensors 306, 308, 310, 312, and 316 of the first and second sensor units 304 and 314 to the control module 300.

The first sensor unit 304 includes first to fourth sensors 306 to 312 for sensing pressures applied to respective portions of the Z axis support plate. The first to fourth sensors are distributed and installed between the Z axis support plate and the Z axis base. The control module detects the tilting of the Z axis support plate using the sensed data provided by the sensors of the first sensor unit. The second sensor unit 314 is implemented as a fifth sensor 316, which is installed between the Z axis transferring unit and a Z axis motor and is configured to sense whether excessive pressure is being applied to the Z axis transferring unit.

The second interface 317 provides various types of information provided by the control module 300 to the first to fourth piezoelectric driving units 318 to 324 and the main control device of the wafer prober.

The first to fourth piezoelectric driving units 318, 320, 322 and 324 drive the first to fourth piezoelectric actuators 326, 328, 330, and 332 in response to a control command from the control module 300.

The first to fourth piezoelectric actuators 326, 328, 330, and 332 are distributed and installed between the Z axis support plate 334 and the Z axis base 321, and are configured to lift up the Z axis support plate in proportion to the degree of the tilting of the Z axis support plate, thus enabling the Z axis support plate 334 and the chuck plate 307 to be in a horizontal state.

When a message indicating that excessive pressure is being applied in the direction of the Z axis is received from the control module 300, the main control device discontinues the operation of the Z axis motor 319, and informs the manager of the application of the excessive pressure.

Figure 4:
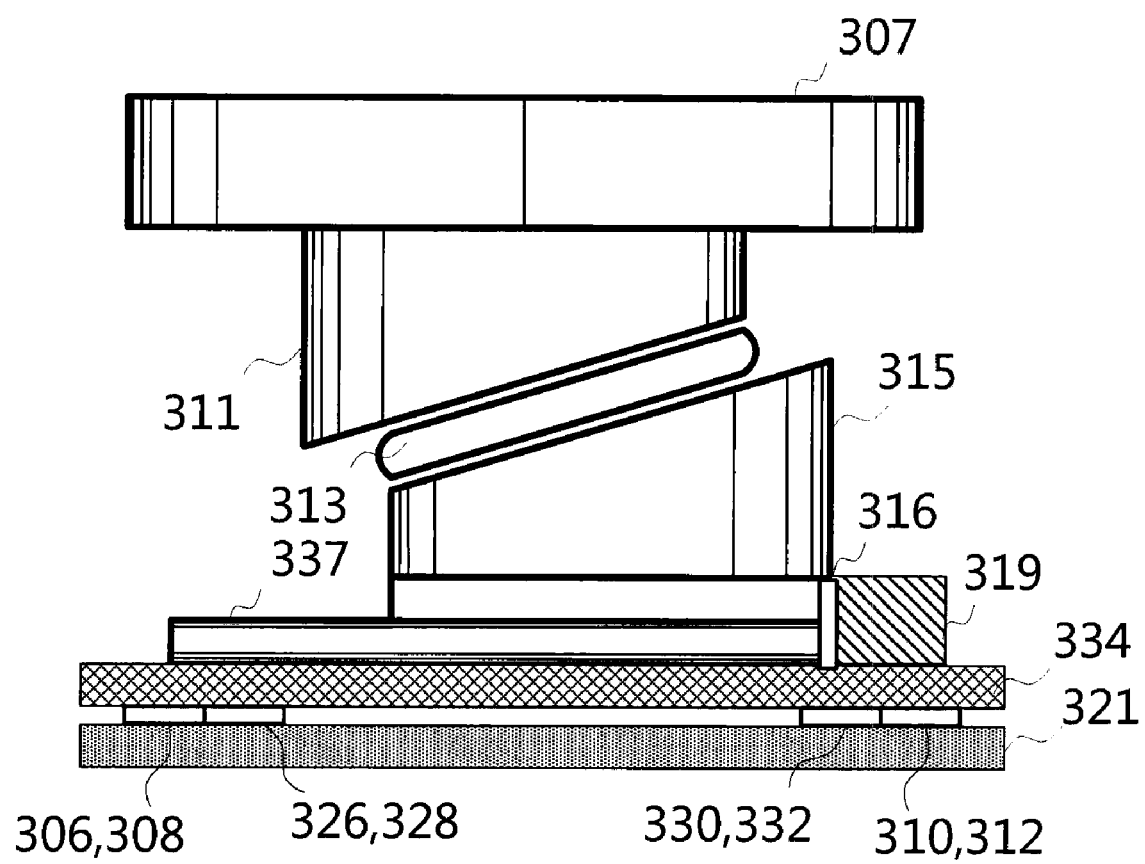
FIG. 4 is a view showing an example of the installation of sensors according to an embodiment of the present invention.

Hereinafter, with reference to FIG. 4, the location of the installation of the first and second sensor units 304 and 314, and the first to fourth piezoelectric actuators 326 to 332, and the location of the displacement measuring instrument 336 are described below. The displacement measuring instrument 336 indicates the occurrence of excessive pressure being applied along the Z axis direction. The first to fourth sensors 306, 308, 310, and 312 of the first sensor unit 304 are installed between respective four corners of the rectangular Z axis support plate 334 and the rectangular Z axis base 321, and are configured to sense pressures being applied to the four corners and to provide sensed data to the control module 300. The fifth sensor 316 of the second sensor unit 314 is installed between a Z axis transferring unit 315 and the Z axis motor 319, and is configured to sense whether excessive pressure is being applied to the Z axis transferring unit 315 and provide sensed data to the control module 300. In this case, the displacement measuring instrument 336 for generating displacement corresponding to a specific pressure is used to measure the excessive pressure applied to the Z axis transferring unit 315.

Figure 8:
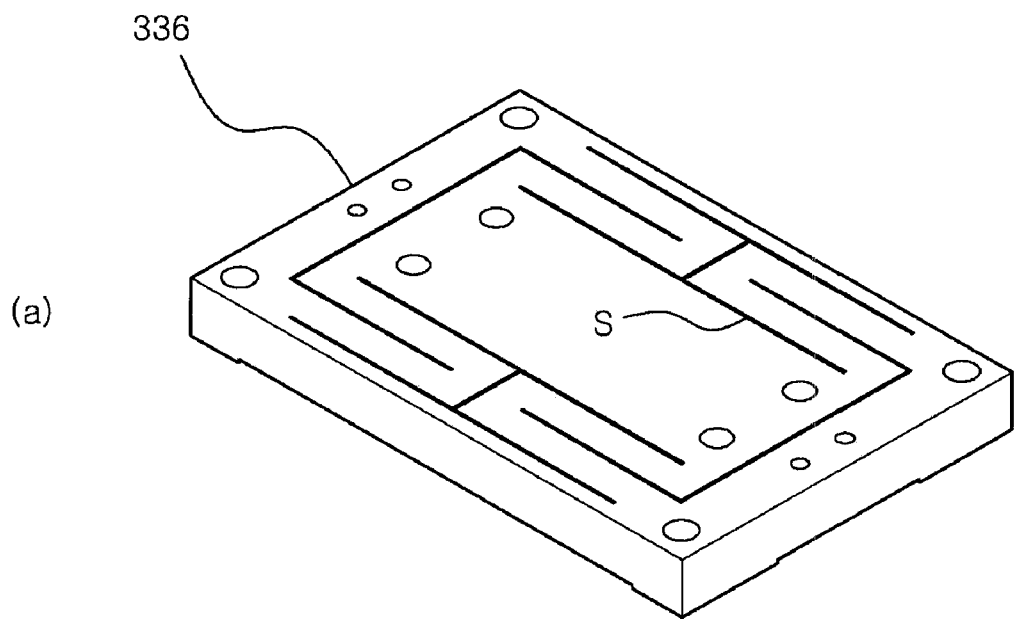
FIG. 8 is a diagram showing a displacement measuring instrument according to an embodiment of the present invention, and an example of the installation of the instrument.
Figure 8:
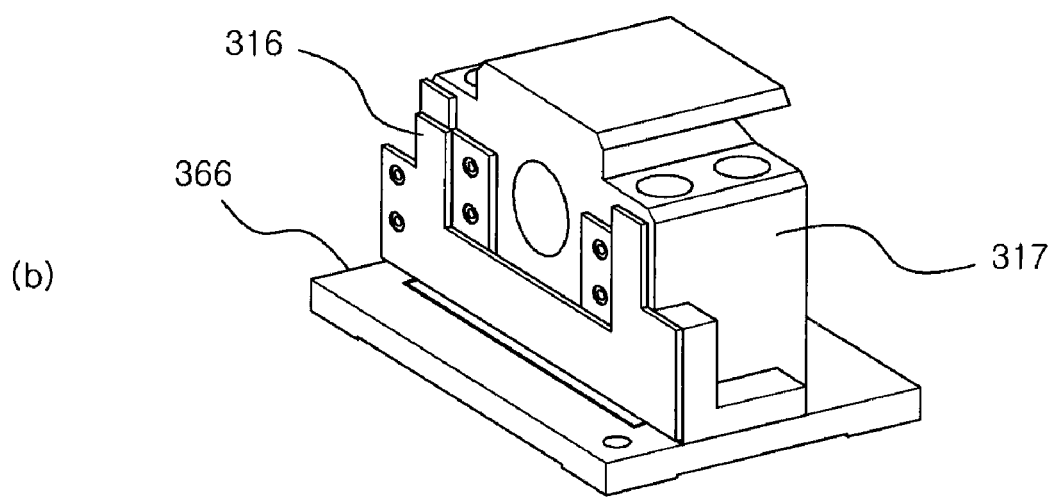

Hereinafter, with reference to FIG. 8, the displacement measuring instrument 366 will be described in detail.

The displacement measuring instrument 336 is installed so as to come into contact with the fifth sensor 316, and is configured such that, when the Z axis motor 319 applies pressure greater than a preset pressure value to the Z axis transferring unit 315, the displacement measuring instrument is contracted, with the result that the pressure is being applied to the fifth sensor 316. In this way, the displacement measuring instrument 336 can designate a limit value for pressures greater than a predetermined pressure while assisting in the function of the fifth sensor 316. The displacement measuring instrument 336 has a slit S formed in a steel plate, having rigidity, along the direction of the application of pressure. The displacement measuring instrument sustains pressures leading up to a preset value, but is contracted and deformed by the slit S when pressure greater than the preset value is being applied.

The first to fourth piezoelectric actuators 326 to 332 are installed between four corresponding corners of the rectangular Z axis support plate 334 and the rectangular Z axis base 321, and are preferably installed to correspond to the installation locations of the first to fourth sensors 306 to 312. Under the control of the control module 300, the first to fourth piezoelectric actuators 326 to 332 lift up portions of the four corners of the Z axis support plate, which are the installation locations, thus maintaining the Z axis support plate in a horizontal state.

Capacitive (CAP) sensors are used as the first to fifth sensors 306 to 312 and 316, which will be described in detail below.

Figure 5:
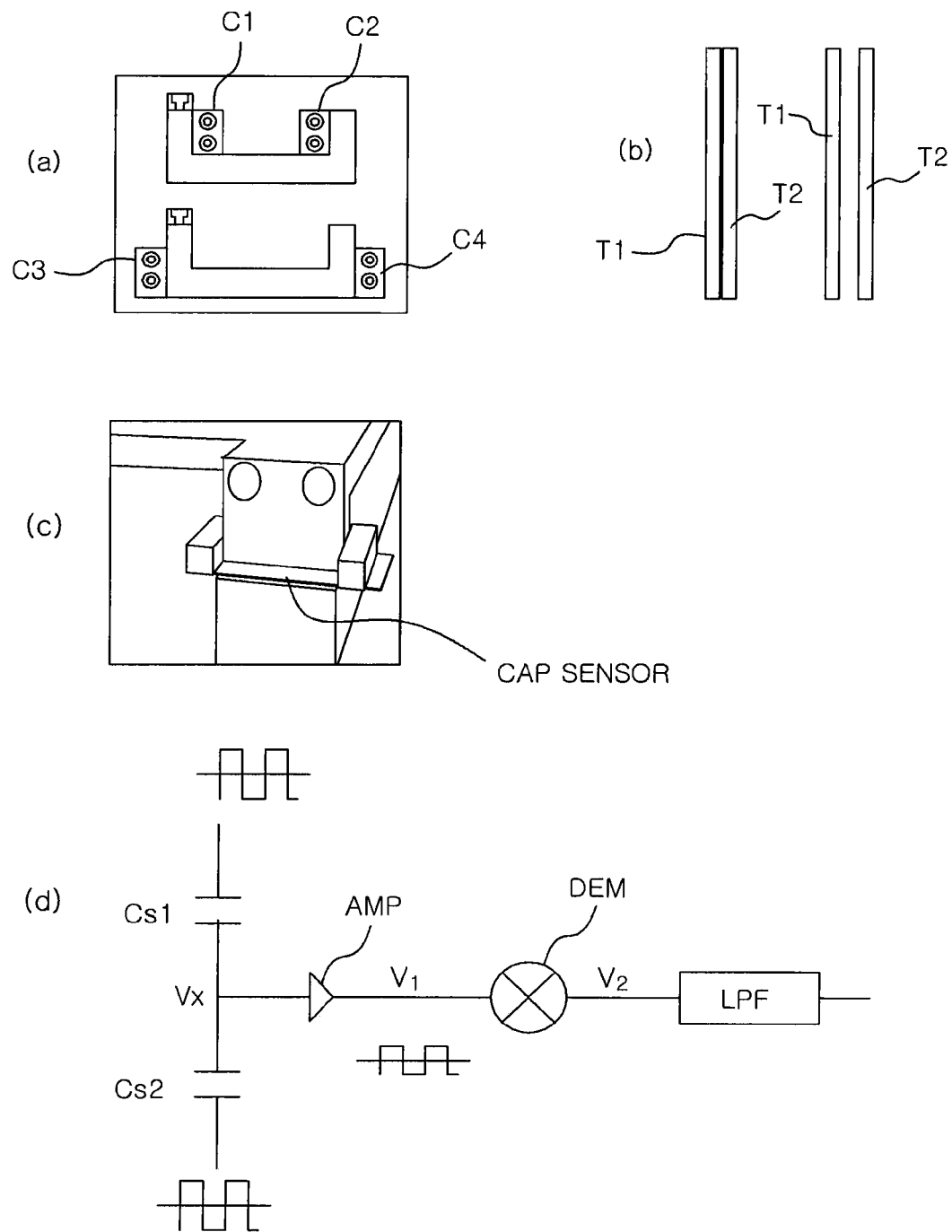
FIG. 5 is a diagram showing the detailed construction of a sensor according to an embodiment of the present invention.

FIG. 5(a) illustrates a CAP sensor according to an embodiment of the present invention. The CAP sensor is configured such that variable capacitors having capacitances varying according to pressure are installed inside or outside a "U"-shaped PCB. In the CAP sensor, as the distance between the electrode plates T1 and T2 is varied due to pressure, as shown in FIG. 5(b), the capacitance of each capacitor is varied. FIG. 5(c) illustrates an example of the installation of the CAP sensor. When portions of the Z axis support plate 334 and the Z axis base 321 are coupled to each other, the CAP sensor is interposed between the Z axis support plate 334 and the Z axis base 321, thus sensing pressure applied to the portions. FIG. 5(d) is a circuit diagram of the CAP sensor. Referring to FIG. 5(d), the CAP sensor includes first and second variable capacitors C1 and C2, connected in series with each other, an amplifier AMP disposed at a connection node of the series-connected first and second variable capacitors C1 and C2, a demodulator DEM connected to the output terminal of the amplifier, and a Low Pass Filter LPF connected to the output terminal of the demodulator. As the capacitances of the first and second variable capacitors C1 and C2 are varied according to pressure, the amplifier AMP amplifies an output signal at the connection node, and provides the amplified signal to the demodulator DEM. The demodulator DEM demodulates the output signal, and provides the demodulated signal to the low pass filter LPF. The LPF performs low-pass filtering on the output signal of the demodulator DEM and outputs a resulting signal as a sensed signal that is output.

Figure 6:
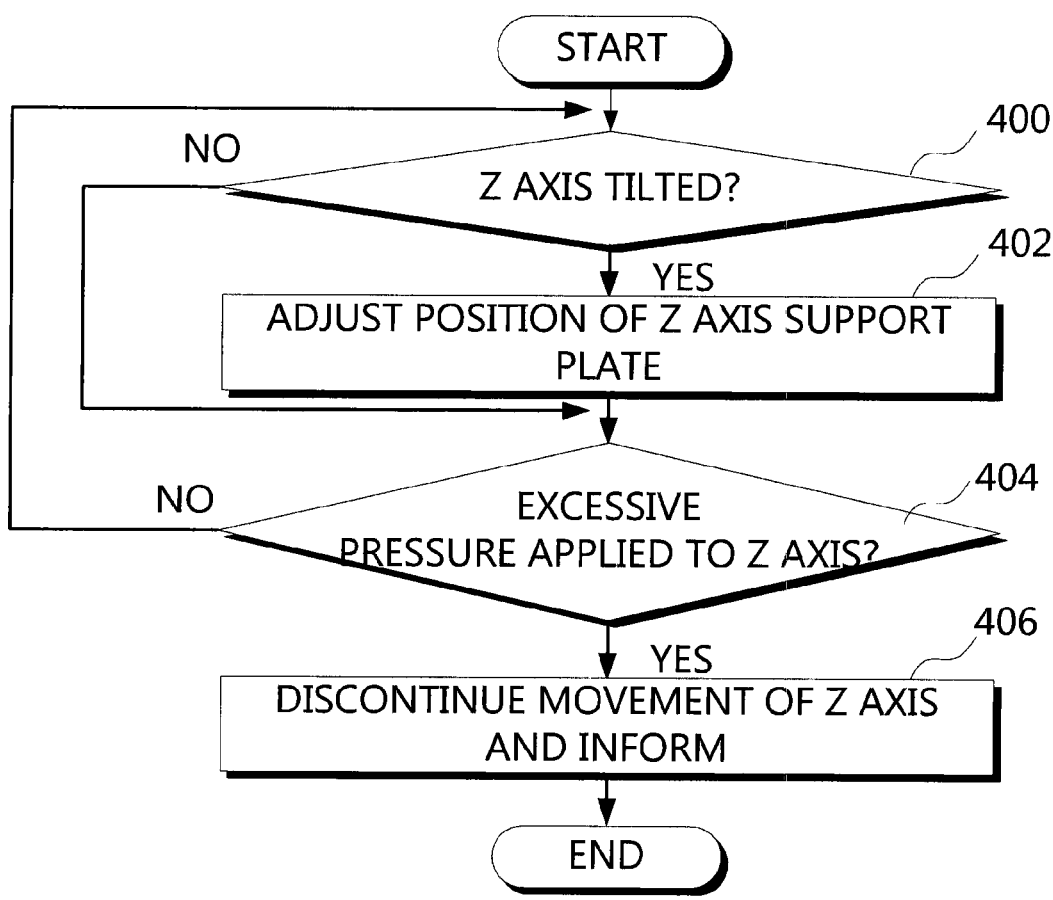
FIG. 6 is a flowchart showing the process of an apparatus for controlling a Z axis position according to the present invention.

Hereinafter, the operation of the Z axis position control apparatus for a wafer prober, having the above construction, is described below with reference to FIG. 6.

The control module 300 determines whether the difference between respective pieces of sensed data provided by the first to fourth sensors 306 to 312 is greater than a preset difference limit value, thus determining whether the Z axis support plate 334 is tilted at step 400.

Figure 7:
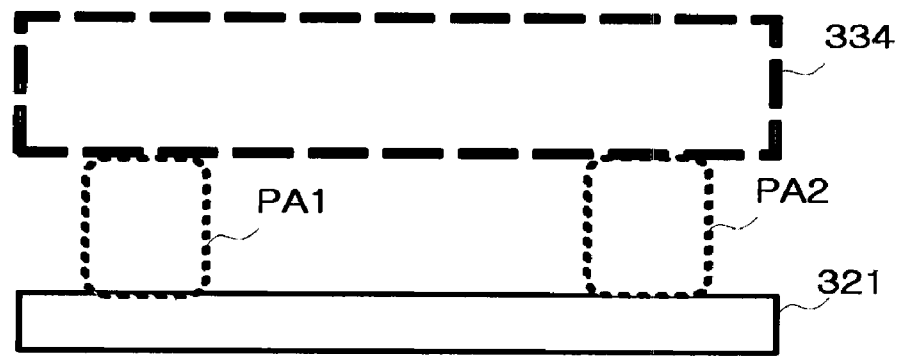
FIG. 7 is a diagram showing the state of position control according to an embodiment of the present invention.
Figure 7:
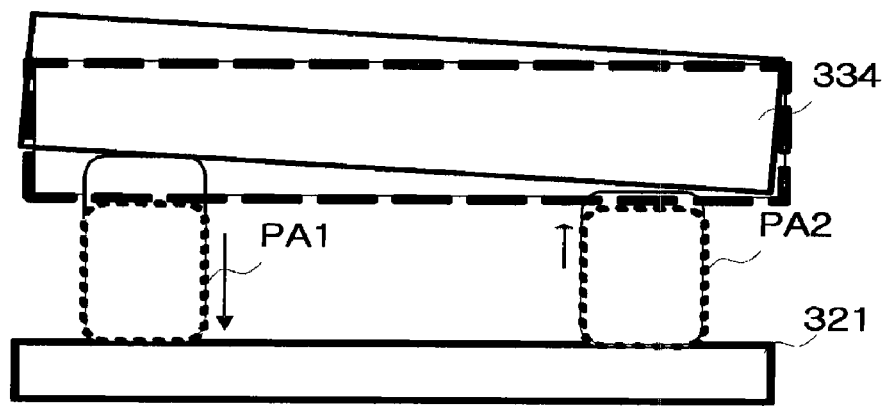
Figure 7:
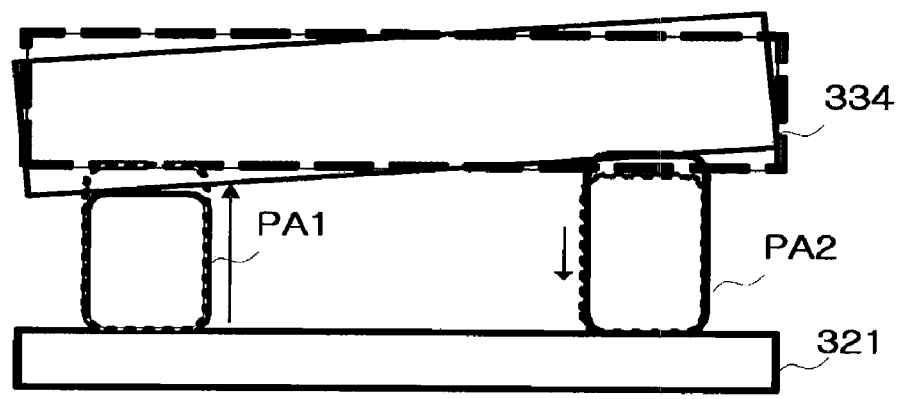

If it is determined that the Z axis support plate is tilted, the control module 300 lifts up a piezoelectric actuator installed closest to a sensor, which is pressed more than any of the other sensors, and lowers the remaining piezoelectric actuators, thus correcting the tilting of the Z axis support plate 334 so that the Z axis support plate 334 is maintained in a horizontal state. That is, the Z axis support plate 334 is maintained in an entirely horizontal state by lifting up a portion of the Z axis support plate, which is tilted down, and by lowering the portion of the Z axis support plate, which is lifted up, at step 402. This operation will be described in detail with reference to FIG. 7. FIG. 7(a) illustrates an example in which the Z axis support plate 334 is maintained in a horizontal state. In this case, the piezoelectric actuators PA1 and PA2 support the Z axis support plate 334.

FIG. 7(b) illustrates the state in which a right portion of the Z axis support plate 334 is lowered, as indicated by a solid line, and this is overdrawn for easy understanding of the operating states of the piezoelectric actuators PA1 and PA2. As shown in FIG. 7(b), the right piezoelectric actuator PA2 is driven upwards, thus lifting up the right portion of the Z axis support plate 334, and the left piezoelectric actuator PA1 is driven downwards, thus lowering the left portion of the Z axis support plate 334. In this way, as indicated by a dotted line, the Z axis support plate 334 is maintained in an entirely horizontal state.

FIG. 7(c) illustrates the state in which a left portion of the Z axis support plate 334 is lowered, as indicated by a solid line, and this is overdrawn for easy understanding of the operating states of the piezoelectric actuators PA1 and PA2. As shown in FIG. 7(c), the right piezoelectric actuator PA2 is driven downwards, thus lowering the right portion of the Z axis support plate 334, and the left piezoelectric actuator PA1 is driven upwards, thus lifting up the left portion of the Z axis support plate 334. In this way, as indicated by a dotted line, the Z axis support plate 334 is maintained in an entirely horizontal state.

Meanwhile, the control module 300 checks whether the sensed data provided by the fifth sensor 314 is greater than a preset value, and determines that excessive pressure is being applied when the pressure applied to the Z axis transferring unit 315 by the Z axis motor 319 is greater than the preset value at step 404.

If it is determined that the pressure being applied to the Z axis transferring unit 315 is greater than the preset value, the control module 300 transmits a message, notifying an examiner of the application of the excessive pressure, to the main control device so as to inform the examiner of the application of the excessive pressure while discontinuing the driving of the Z axis motor 319 at step 406.

Although the preferred embodiments of the present invention have been disclosed for illustrative purposes, those skilled in the art will appreciate that various modifications and applications are possible, without departing from the scope and spirit of the invention. It should be noted that differences related to such modifications and applications are included in the scope of the present invention defined by the accompanying claims.

[Industrial Applicability]

An apparatus for controlling the Z axis position of a wafer prober according to the present invention is a device for maintaining the horizontal state of the chuck plate of the wafer prober, and can be widely used in wafer probers.

The invention claimed is:

1. An apparatus for controlling a Z axis position of a wafer prober, the wafer prober including a chuck plate, a Z axis transferring unit for vertically transferring the chuck plate, and a Z axis base for supporting the Z axis transferring unit, comprising:
    a Z axis support plate interposed between the Z axis transferring unit and the Z axis base, and configured to support the Z axis transferring unit;
    a first sensor unit including a plurality of pressure sensors distributed and installed between the Z axis support plate and the Z axis base;
    a plurality of actuators distributed and installed below the Z axis support plate and configured to lift up or lower the Z axis support plate;
    an actuator driving unit configured to drive the plurality of actuators; and
    a control module configured to detect whether the Z axis support plate is tilted using pieces of sensed data provided by the pressure sensors of the first sensor unit, and to drive the actuators by controlling the actuator driving unit on a basis of results of the detection, thus enabling the chuck plate to be maintained in a horizontal state.

2. The apparatus according to claim 1, wherein the control module sets a difference limit value between pieces of sensed data in advance, detects a difference between the pieces of sensed data provided by the first sensor unit, and controls the actuator driving unit when the detected difference is greater than the difference limit value.

3. The apparatus according to claim 1, further comprising a motor for providing a driving torque to the Z axis transferring unit and a second sensor unit implemented as a pressure sensor installed between the Z axis transferring unit and the motor,
    wherein the control module is provided with sensed data by the second sensor unit, and notifies a main control device of the wafer prober of a message, indicating that excessive pressure is being applied, when the sensed data provided by the second sensor unit is greater than a preset pressure limit value.

4. The apparatus according to claim 3, further comprising one or more displacement measuring instruments respectively installed between one or more of the pressure sensors and a pressure application tool for applying pressure to the pressure sensor,
    wherein each of the displacement measuring instruments has a slit formed in a direction in which the pressure is being applied, so that, when the applied pressure becomes greater than a predetermined pressure, the displacement measuring instrument is contracted and deformed, thus applying pressure to the one or more pressure sensors.

5. The apparatus according to claim 3, wherein:
    the pressure sensors are implemented as Capacitive (CAP) sensors; and
    each of the CAP sensors comprises:
    a plurality of series-connected variable capacitors, capacitances of which are varied according to pressure;
    an amplifier disposed at a connection node of the variable capacitors and configured to amplify an output signal, which is varied according to variation in capacitances of the variable capacitors;
    a demodulator configured to demodulate an output signal of the amplifier; and
    a filter configured to perform low-pass filtering on an output of the demodulator.

6. The apparatus according to claim 1, further comprising one or more displacement measuring instruments respectively installed between one or more of the pressure sensors and a pressure application tool for applying pressure to the pressure sensor,
    wherein each of the displacement measuring instruments has a slit formed in a direction in which the pressure is being applied, so that, when the applied pressure becomes greater than a predetermined pressure, the displacement measuring instrument is contracted and deformed, thus applying pressure to the one or more pressure sensors.

7. The apparatus according to claim 1, wherein:
    the pressure sensors are implemented as Capacitive (CAP) sensors; and
    each of the CAP sensors comprises:
    a plurality of series-connected variable capacitors, capacitances of which are varied according to pressure;
    an amplifier disposed at a connection node of the variable capacitors and configured to amplify an output signal, which is varied according to variation in capacitances of the variable capacitors;
    a demodulator configured to demodulate an output signal of the amplifier; and
    a filter configured to perform low-pass filtering on an output of the demodulator.

8. The apparatus according to claim 1, wherein the actuators are piezoelectric actuators.

9. The apparatus according to claim 1, wherein the actuators are installed to correspond to respective pressure sensors of the first sensor unit, and are installed closest to corresponding pressure sensors.

* * * * *